US007797665B1

(12) United States Patent
Xu et al.

(10) Patent No.: US 7,797,665 B1
(45) Date of Patent: Sep. 14, 2010

(54) PATTERNS FOR ROUTING NETS IN A PROGRAMMABLE LOGIC DEVICE

(75) Inventors: Hui Xu, Menlo Park, CA (US); Vinay Verma, San Jose, CA (US); Anirban Rahut, Santa Clara, CA (US); Jason H. Anderson, Toronto (CA); Sandor S. Kalman, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 490 days.

(21) Appl. No.: 11/999,559

(22) Filed: Dec. 6, 2007

(51) Int. Cl.
*G06F 17/50* (2006.01)

(52) U.S. Cl. .......................................................... 716/16

(58) Field of Classification Search .................... 716/16
See application file for complete search history.

(56) References Cited

U.S. PATENT DOCUMENTS 5,598,343 A * 1/1997 Roy et al. ..................... 716/16
7,194,720 B1 * 3/2007 Borer et al. ................... 716/16
7,669,164 B1 * 2/2010 Ma et al. ...................... 716/17

OTHER PUBLICATIONS

Dijkstra, E.W.; "A Note on Two Problems in Connexion with Graphs"; Numerische Mathematik 1, 1959; pp. 269-271.

* cited by examiner

*Primary Examiner*—Jack Chiang
*Assistant Examiner*—Brandon W Bowers
(74) *Attorney, Agent, or Firm*—LeRoy D. Maunu; Lois D. Cartier

(57) ABSTRACT

Nets of a logic design are efficiently routed in a programmable logic device, which includes multiple types of programmable interconnects. Patterns are read from a library in a storage device. Each pattern includes an ordered set of the types of the programmable interconnects. A path is determined from the source to the destination for each net of the logic design. The path is through a sequence of the programmable interconnects having types that correspond to each type in the ordered set of a selected pattern. A description is output of the path for each of the nets.

20 Claims, 5 Drawing Sheets

102 For each pairing of a source and a destination in the programmable logic device, route a net from the source to the destination without using patterns 104 Analyze quality of routed paths for the nets according to a metric of propagation delay, power dissipation, skew from target, or resource usage 106 Create a library of the patterns of the paths having a high quality, each pattern including an ordered set of the types of programmable interconnect along a path 108 Read in library of patterns from a storage device 110 Determine a path corresponding to a selected pattern from a source to a destination of each net in a logic design 112 Remove overlap of the programmable interconnect between the paths for the nets, including determining an alternative path for a net through the types of programmable interconnects of a selected pattern for the net

PATTERNS FOR ROUTING NETS IN A PROGRAMMABLE LOGIC DEVICE

FIELD OF THE INVENTION

The present invention generally relates to the routing of nets of a logic design, and more particularly to the routing of nets of a logic design in a programmable logic device.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Computer-aided design tools generate the configuration data for programming the PLD from a description of a logic design. A designer uses a design capture tool to describe the logic components of the logic design and the connections between these logic components. This results in a textual description of the logic design in a hardware description language (HDL). A synthesis tool compiles the HDL description into a specification of the logic design using basic circuit elements, such as logic gates, look-up tables, and memory blocks. A placement tool places the circuit elements in the programmable logic of the PLD. A routing tool connects the placed circuit elements with nets routed through the programmable interconnect of the PLD. A programming tool generates the configuration data from the placed and routed logic design.

Analysis tools analyze the operating characteristics of the implementation of the logic design in the PLD. For example, timing analysis tools establish an operating frequency of the logic design implemented in the PLD. The operating characteristics of the implementation of the logic design in the PLD depend on the capabilities of these computer-aided design tools.

The present invention addresses one or more issues arising from the design flow described above.

SUMMARY

Various embodiments of the invention provide a method for routing the nets of a logic design in a programmable logic device, which includes multiple types of programmable interconnects. Patterns are read from a library in a storage device. Each pattern includes an ordered set of the types of the programmable interconnects. A path is determined from the source to the destination for each net of the logic design. The path is through a sequence of the programmable interconnects having types that correspond to each type in the ordered set of a selected pattern. A description is output of the path for each of the nets.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

Figure 1:
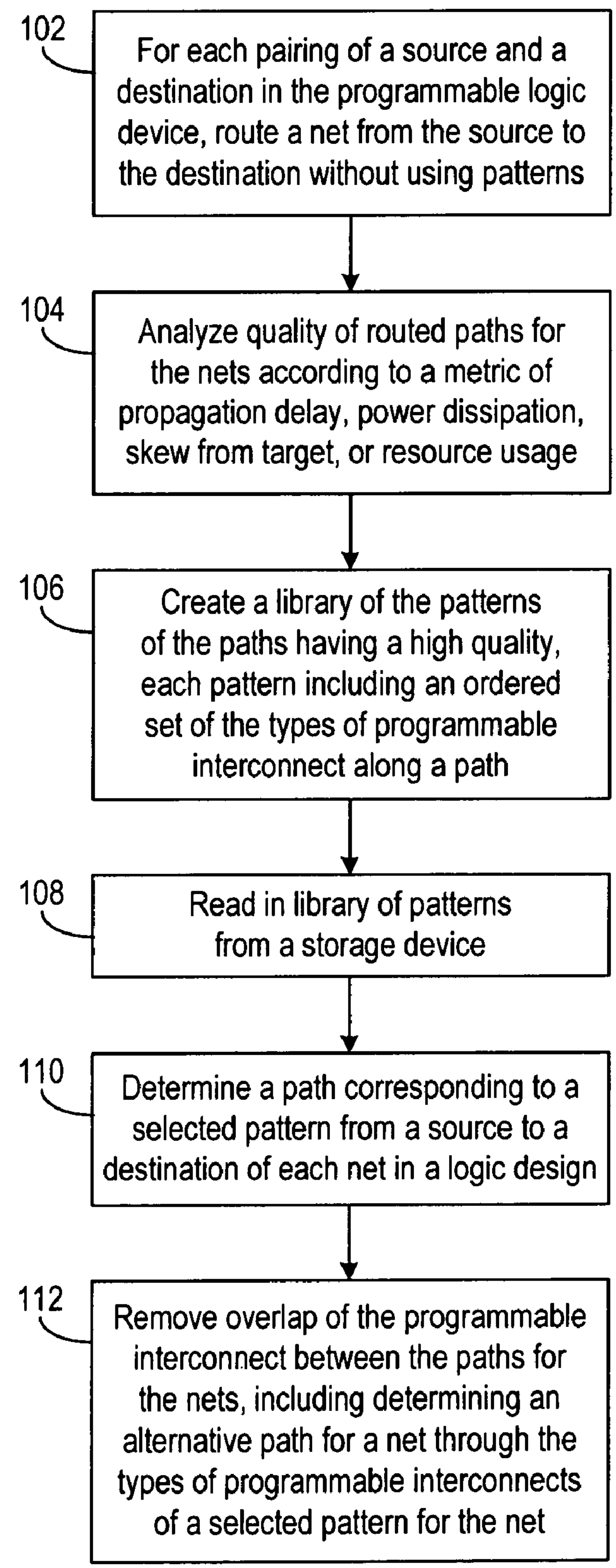
FIG. 1 is a flow diagram of a process for routing nets of a logic design in a programmable logic device in accordance with various embodiments of the invention.

FIG. 1 is a flow diagram of a process for routing nets of a logic design in a programmable logic device (PLD) in accordance with various embodiments of the invention. Analysis of example routes creates patterns for routing a logic design in the PLD.

At step 102, a routing tool creates example routing paths between sources and destinations without using patterns. In one embodiment, the routing tool creates one or more paths through the programmable interconnect of the PLD for each pairing of a source and a destination. Thus, there are example paths routed between every source and every destination. In another embodiment, the routing tool creates paths through the programmable interconnect for each pairing of a source and a destination within a representative portion of the PLD. At step 104, an analysis tool analyzes the quality of each example path according to a quality metric, such as propagation delay of the example path, power dissipation from the example path, deviation or skew of the example path from a targeted propagation delay, and/or utilization of the programmable interconnect resources by the example path.

At step 106, the process creates a library of patterns. Each pattern is an ordered set of the types of the programmable interconnect along one or more of the example paths having a high quality. An example high-quality path from a source to a destination could pass through two programmable interconnects, and the corresponding pattern is an ordered set of two elements, which are the two types of the two programmable interconnects. The ordering of the two types in the ordered set corresponds to the order of corresponding programmable interconnects along the example high-quality path starting at the source and ending at the destination. The example high-quality path could utilize two programmable interconnects of the same type, and then the corresponding pattern is an ordered set including two elements of this type. In one embodiment, each pattern in the library includes a type of each source having a high-quality path matching the pattern and beginning at the source, and each pattern in the library includes a type of each destination having a high-quality path matching the pattern and ending at the destination.

At step 108, the process reads the patterns from the library on a storage device. At step 110, the process selects a pattern for each net of the logic design, and determines a path from the source of the net to the destination of the net through a sequence of programmable interconnects matching the selected pattern. In one embodiment, the process selects a pattern for each destination of a net of the logic design, and separately determines a path from the source to each destination of the net through a sequence of programmable interconnects matching the selected pattern for the destination of the net.

Each net of the logic design can be independently routed in step 110 without regard to whether any programmable interconnect is already reserved for routing another net of the logic design. At step 112, the process removes any overlap between the paths of two or more nets using the same programmable interconnect of the PLD. In one embodiment, a cost is assigned to each programmable interconnect and the cost of overlapping programmable interconnects increases iteratively until cost minimization removes the overlap. During the cost minimization, the process determines an alternative path for the net of an overlapping path with the alternative path corresponding to a selected pattern for the net.

Figure 2:
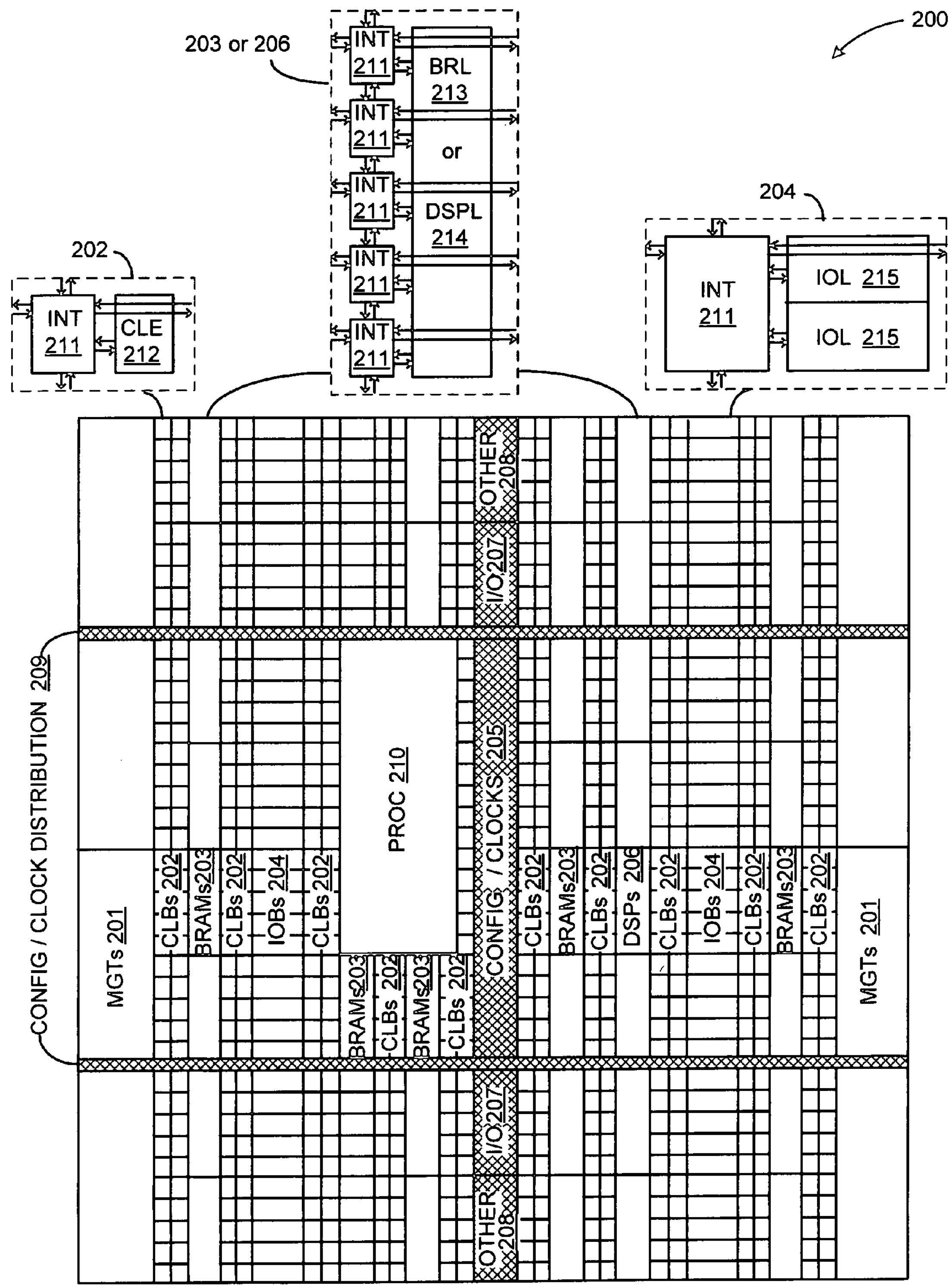
FIG. 2 is a block diagram illustrating an exemplary programmable logic device for routing nets using patterns in accordance with various embodiments of the invention.

FIG. 2 is a block diagram illustrating an exemplary programmable logic device for routing nets using patterns in accordance with various embodiments of the invention. As noted above, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 206 can include a DSP logic element (DSPL 214) in addition to an appropriate number of programmable interconnect elements. An 10B 204 can include, for example, two instances of an input/output logic element (IOL 215) in addition to one instance of the programmable interconnect element (INT 211). As will be clear to those of skill in the art, the actual I/O pads connected, for example, to the I/O logic element 215 typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 3A:
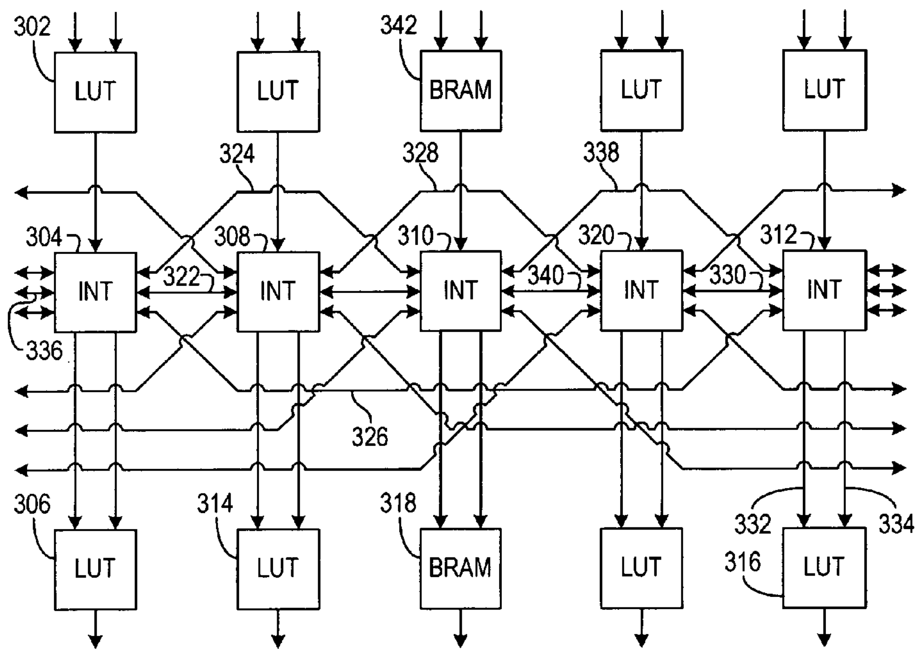
FIGS. 3A and 3B are block diagrams illustrating programmable interconnects for routing in accordance with various embodiments of the invention.
Figure 3B:
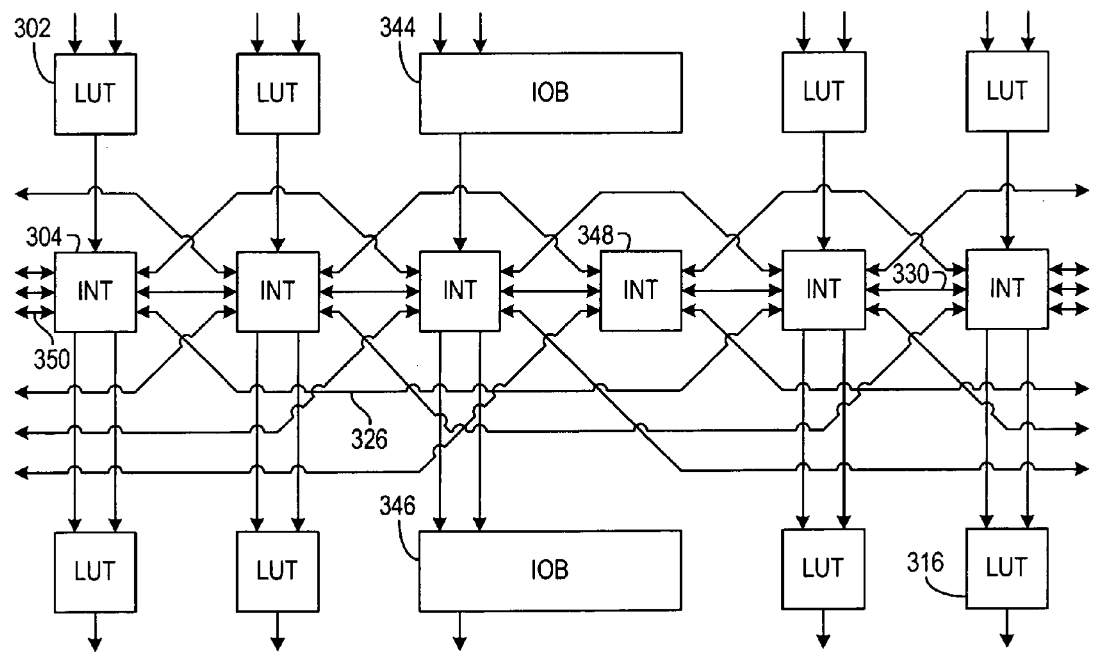

FIGS. 3A and 3B are block diagrams illustrating programmable interconnects for routing in accordance with various embodiments of the invention. The programmable interconnects are programmable to form connections between programmable logic elements as determined by a routing tool.

For example, lookup table (LUT) 302 is programmable logic and an output of lookup table 302 is connected to programmable interconnect element (INT) 304. Programmable interconnect element 304 can connect the output from lookup table 302 to certain inputs of lookup table 306, or to other programmable interconnect elements including programmable interconnect elements 308, 310, and 312, which further permit the output from lookup table 302 to connect to inputs of lookup tables 314 and 316, and inputs of block RAM (BRAM) 318.

The programmable interconnects have various types, even though programmable interconnect elements 304, 308, 310, 312, and 320 can be identical. For example, the programmable interconnect on line 322 connects element 304 with adjacent element 308, the programmable interconnect on line 324 connects element 304 with element 310, and the programmable interconnect on line 326 connects element 304 with element 312. In one embodiment, the corresponding types are denoted according to the length of the programmable interconnect, with the types of "ADJACENT" for the programmable interconnect on line 322, "DOUBLE" for the programmable interconnect on line 324, and "QUAD" for the programmable interconnect on line 326.

The programmable interconnects can further include additional types such as "INMUX" for input multiplexers (not shown) for selecting between various inputs of a programmable interconnect element, and "OUTMUX" for output multiplexers (not shown) that select an output of a programmable interconnect element from various internal signals of the programmable interconnect element. In one embodiment, a programmable logic device has ten different types of programmable interconnect. Those skilled in the art will recognize that other PLDs may also include a plurality of different types of programmable interconnects ranging from as few as two to as many as may be desirable to satisfy the objectives and requirements for the PLD.

For an example logic design already placed in the programmable logic, a net of the logic design connects the output of lookup table 302 to an input of lookup table 316. The net can be connected by the path from the output of lookup table 302 through programmable interconnect element 304, the programmable interconnect on line 322, programmable interconnect element 308, the programmable interconnect on line 328, programmable interconnect element 320, the programmable interconnect on line 330, and programmable interconnect element 312 to an input of lookup table 316. The types of the sequence of programmable interconnects along this path is the ordered set (ADJACENT, DOUBLE, ADJACENT). The net can also be connected by the alternative path from the output of lookup table 302 through programmable interconnect element 304, the programmable interconnect on line 326, and programmable interconnect element 312 to an input of lookup table 316. The types of the sequence of programmable interconnects along this path is the ordered set (QUAD).

In one embodiment, an analysis of example routing paths determines whether the path with ordered set (ADJACENT, DOUBLE, ADJACENT) is better according to a quality metric than the alternative path with ordered set (QUAD). In one example, a quality metric of propagation delay could determine that the ordered set (ADJACENT, DOUBLE, ADJACENT) is better than the ordered set (QUAD) because, for example, the long wire on line 326 for the QUAD type of programmable interconnect contributes a large propagation delay. Because of this, the (ADJACENT, DOUBLE, ADJACENT) ordered set becomes a pattern in a library for the propagation delay metric, and the library omits the (QUAD) ordered set as a pattern for connecting lookup table 302 to lookup table 316. It will be appreciated that the (QUAD) ordered set could be selected as a pattern for connecting a different pairing of source and destination.

In another example, a different quality metric of power dissipation could determine that the pattern of the ordered set (QUAD) is better. Because of this, the (QUAD) ordered set becomes a pattern in another library for the power dissipation metric and this library omits the (ADJACENT, DOUBLE, ADJACENT) ordered set as a pattern for connecting lookup table 302 to lookup table 316.

The analysis of the example routing patterns could determine that that the ordered set (ADJACENT, DOUBLE, ADJACENT) is better for routing from an output of lookup table 302 to the input on line 332 of lookup table 316, and the ordered set (QUAD) is better for routing from an output of lookup table 302 to the input on line 334 of lookup table 316. Thus, the library includes both pattern (ADJACENT, DOUBLE, ADJACENT) and pattern (QUAD) for a net connecting an output of lookup table 302 to an input of lookup table 316. Because the inputs on lines 332 and 334 are functionally equivalent for lookup table 316, a path can follow either pattern for connecting a net between an output of lookup table 302 and some input of lookup table 316.

A routing tool uses the library of patterns to route the nets of a logic design placed in the programmable logic, such as lookup tables 302 and 316. To route a net connecting an output of lookup table 302 to an input of lookup table 316, the routing tool first selects one or more patterns from the library.

In one embodiment, the library organizes the patterns according to the types of the source and destination and the horizontal and vertical offsets between the source and destination. For a net connecting an output of lookup table 302 with an input of lookup table 316, the source has a type of a lookup table output, the destination has a type of a lookup table input, and the horizontal offset is four columns to the right and the vertical offset is one row down. The library could include a limited number of patterns having these types of source and destination and these magnitudes and directions of the horizontal and vertical offsets between the source and destination. Frequently, one or two patterns match the types and offsets for the source and destination.

The routing tool considers paths matching the pattern or patterns for each net. In one embodiment, the router attempts to route a path between the source and a destination of a net using successive matching patterns for the source and destination. The library could order multiple matching patterns for a source and destination according to the quality metric and the routing tool could consider multiple matching patterns in this order. Once a routing attempt succeeds, the routing tool ignores any additional matching patterns for the source and destination. For a net with multiple destinations, the routing tool routes a separate, potentially overlapping, path between the source and each destination, including determining the matching patterns for the source and each destination.

If the routing tool is unsuccessful after considering every pattern for a source and destination, or the library does not have any matching patterns for a source and destination, then the routing tool routes a path between the source and the destination without using patterns.

For an example of a net of a logic design that connects the output of lookup table 302 to an input of lookup table 316, the matching pattern might be the ordered set (ADJACENT, DOUBLE, ADJACENT). In one embodiment, the routing tool performs a breadth-first search for programmable interconnects matching a current level of the breadth-first search. At the first level of the search, the routing tool searches from programmable interconnect element 304 for the programmable interconnects on lines 322 and 336 having the type of ADJACENT from the first element in the ordered set. Other programmable interconnects, such as programmable interconnects on lines 324 and 326, are pruned from the search. This pruning dramatically increases the efficiency of the routing tool. The breadth-first search continues with a second level searching for programmable interconnects having the type of DOUBLE from the second element in the ordered set. This process continues until the last level of the search finds a path from the source to the destination. It will be appreciated that the search could be a depth first search.

For a net matching multiple patterns, one embodiment of the invention merges the matching patterns into a tree pattern. For an example of a net of a logic design that connects the output of lookup table 302 to an input of lookup table 316, the matching patterns could be the ordered sets (DOUBLE, DOUBLE) for the programmable interconnects on lines 324 and 338, and (DOUBLE, ADJACENT, ADJACENT) for the programmable interconnects on lines 324, 340, and 330. A tree pattern merges these two patterns. The tree has a root node of type DOUBLE and the root node has two child nodes of types DOUBLE and ADJACENT, with the ADJACENT child node having a child node of type ADJACENT. The search for a path from an output of lookup table 302 to an input of lookup table 316 checks for programmable interconnects matching the type of a corresponding node in the tree pattern. Because both matching patterns begin with a DOUBLE type, the first level searches only once for programmable interconnects matching type DOUBLE. In contrast, for a routing tool that does not merge patterns, the routing tool performs the first search level twice by successively searching the two patterns.

FIG. 3B is a block diagram illustrating a modification of the programmable interconnects of FIG. 3A. The block RAMs 342 and 318 of FIG. 3A are replaced with the input/output blocks 344 and 346 in FIG. 3B. Because input/output blocks 344 and 346 are irregular blocks that are wider than block RAMs 342 and 318, FIG. 3B also includes an extra programmable interconnect element 348 for spanning the additional width of input/output blocks 344 and 346. However, the input/output blocks 344 and 346 still count as one column of the horizontal dimension. Thus, in both FIGS. 3A and 3B, a net of an example logic design connecting the output of lookup table 302 to an input of lookup table 316 spans a horizontal offset of four columns to the right and a vertical offset of one row down.

In one example, the routing tool finds a pattern of (QUAD) for a net connecting an output of lookup table 302 to an input of lookup table 316 positioned four columns to the right and one row down in FIG. 3B. The routing tool finds the programmable interconnects on lines 326 and 350 matching the type of QUAD. Because the programmable interconnect on line 326 reaches (and passes through) the region of irregular blocks 344 and 346, the pattern of (QUAD) is dynamically modified to (QUAD, ADJACENT) to compensate for the extra programmable interconnect element 348 for spanning the additional width of irregular blocks 344 and 346. It will be appreciated that the programmable interconnect on line 350 does not have a similar modification unless the programmable interconnect on line 350 also reaches an irregular block. Because of the insertion of the ADJACENT type into the pattern, the routing tool adds the programmable interconnect on line 330 to complete the path.

Figure 4:
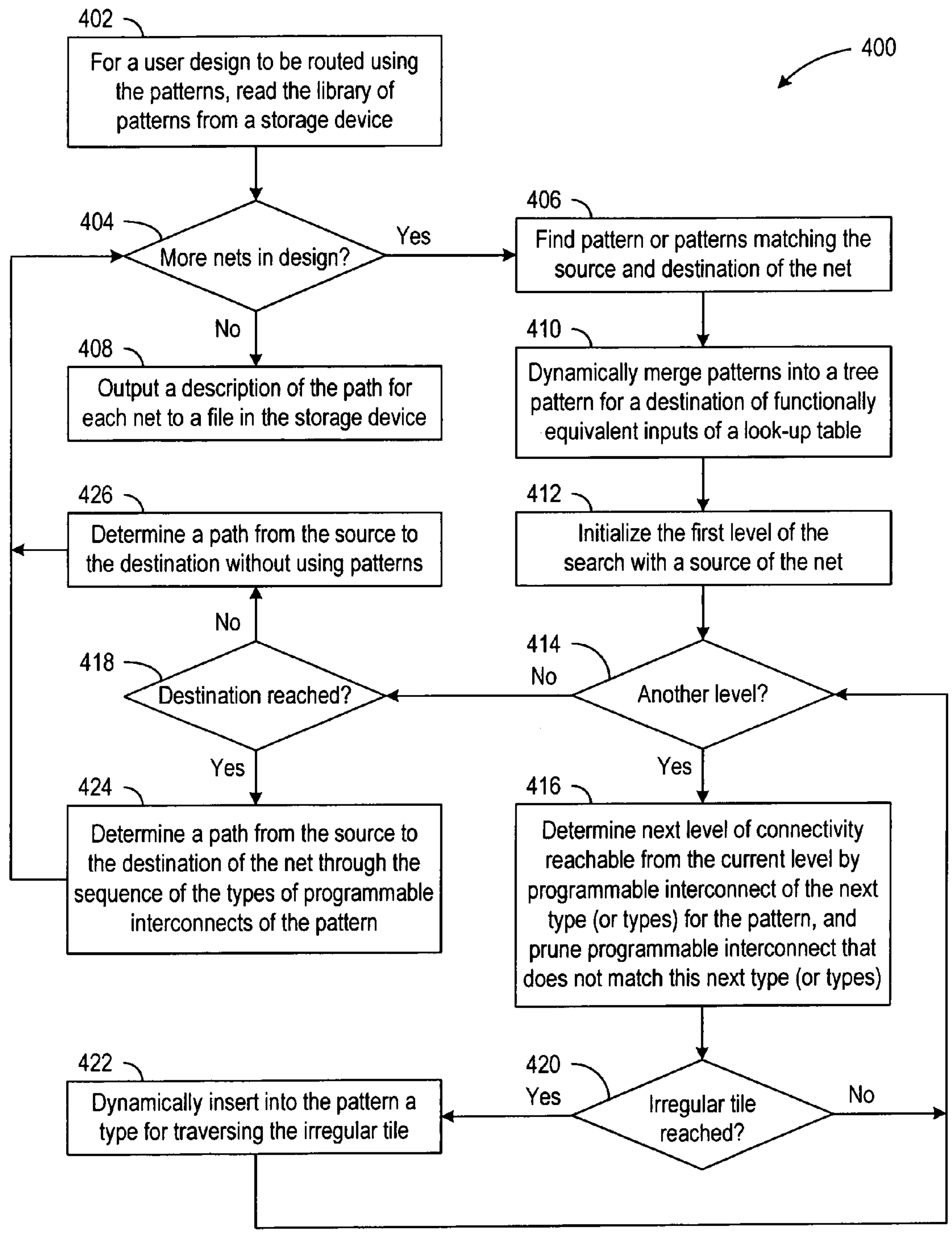
FIG. 4 is a flow diagram of an example process for routing nets using patterns in accordance with various embodiments of the invention.

FIG. 4 is a flow diagram of an example process 400 for routing nets using patterns in accordance with various embodiments of the invention. For each net of a user design, one or more patterns are selected and the net is routed through a sequence of programmable interconnects matching each successive type in the patterns.

At step 402, process 400 reads a library of patterns from a storage device. Decision 404 checks whether the user design has more nets needing routing. If routing is not complete, process 400 proceeds to step 406 to route the next net. Otherwise, routing is complete and process 400 proceeds to step 408 for outputting a description of the routed path for each net. The routing description can be output to a file on a storage device, or passed to another software program, for example.

At step 406, process 400 selects one or more patterns that match the source and destination of the net. In one embodiment, the library includes five thousand patterns, for example, but process 400 selects a limited number, such as zero, one, or two of these patterns at step 406. If process 400 selects multiple patterns because the destination is any of the functionally equivalent inputs of a lookup table, process 400 generates and selects a tree pattern that merges these multiple patterns at step 410.

A search, such as a breadth-first search of a graph representing available connectivity of the programmable interconnects, finds a path through the programmable interconnect by levels. At step 412, the search initializes the first level with the source of the net. Decision 414 checks whether there is another level in the selected pattern. If there is another level, process 400 proceeds to step 416; otherwise, process 400 proceeds to decision 418. At step 416, the search determines the next level of possible connections through programmable interconnects that match the type (or possibly multiple types for a merged tree pattern) for the current level in the ordered set for the selected pattern. The search prunes programmable interconnects that do not match the appropriate type or types for the level from the selected pattern.

Decision 420 checks whether any branch at the current level in the search includes a programmable interconnect reaching an irregular tile, such as an input/output block. For each branch reaching an irregular tile, process 400 dynamically inserts a type for traversing the irregular tile after the current level in the pattern at step 422, and on returning to decision 414 process 400 finds another level and proceeds to step 416 to add a programmable interconnect with the inserted type.

Decision 418 checks whether the search has reached a destination of the net. If the search reaches a destination, process 400 proceeds to step 424. Otherwise, a path does not exist through a sequence of programmable interconnects matching the ordered sets of the types in the pattern, and process 400 proceeds to step 426. At step 424, the search completes the path from the source to the destination of the net through a sequence of the types of programmable interconnects in the pattern. At step 426, process 400 determines a path from the source to the destination without using patterns. For example, a breadth-first search through the programmable interconnects starting from the source could complete when the destination is reached. Process 400 then returns to step 404 to route the next net.

Figure 5:
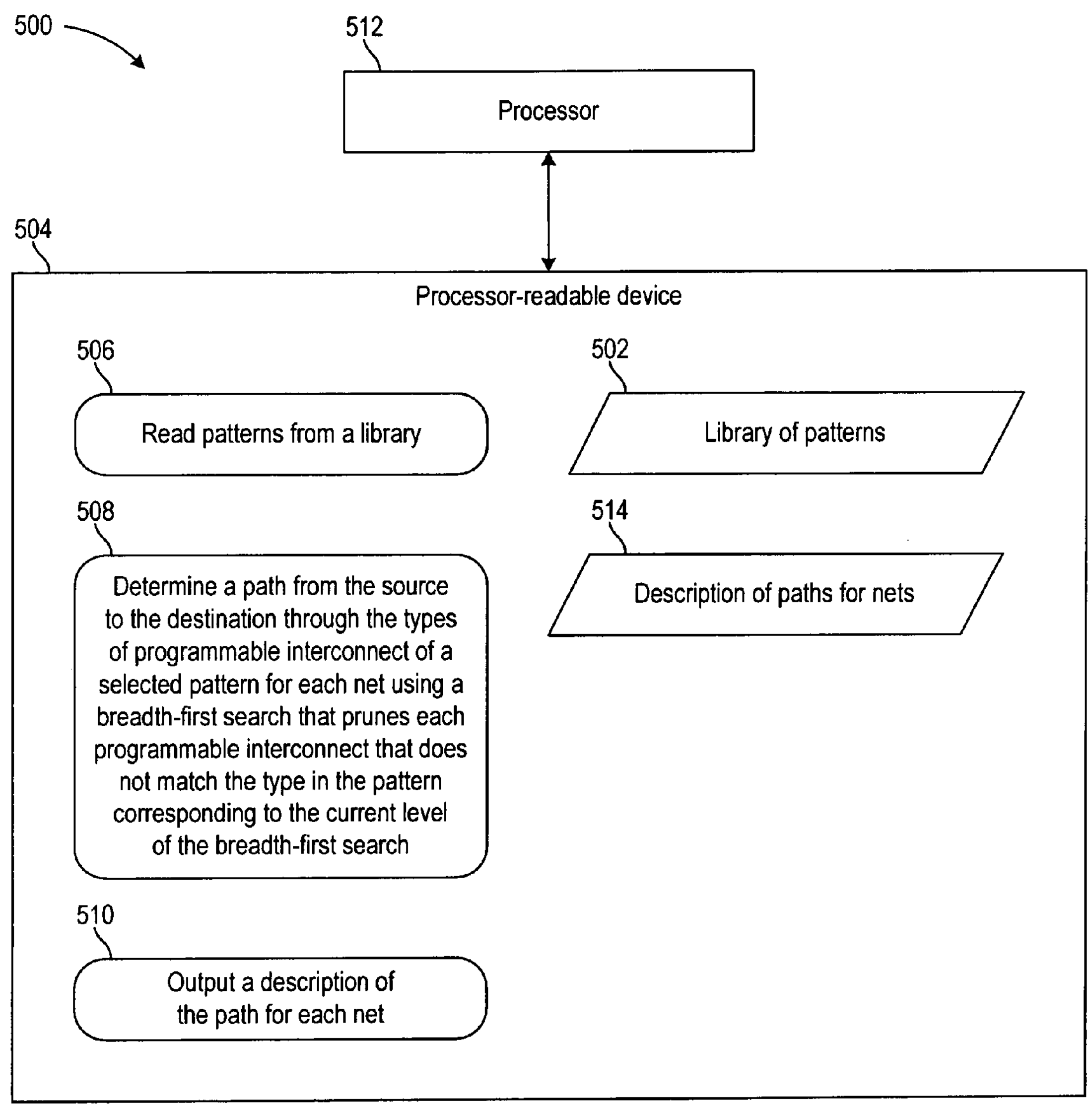
FIG. 5 is a block diagram of a system for routing nets of a logic design in accordance with various embodiments of the invention.

FIG. 5 is a block diagram of a system 500 for routing nets of a logic design in accordance with various embodiments of the invention. In one embodiment, the system 500 provides means for reading patterns from a library 502, means for determining respective paths for the nets through the programmable interconnect, and means for outputting a description of these paths.

Processor-readable device 504 is configured with software modules 506, 508, and 510. Execution of instructions in software module 506 causes processor 512 to read patterns from a library 502 in a processor-readable device 504 or another storage device. Each pattern includes an ordered set of elements with each element being one of the types of the programmable interconnects. Execution of the instructions in software module 508 causes processor 512 to determine a path from the source to the destination of each net. The path passes through a sequence of a respective programmable interconnect for each type in the ordered set of a selected pattern from the library. Each programmable interconnect on the path has the corresponding type from the selected pattern. Execution of the instructions in software module 510 causes processor 512 to output descriptions of the paths for the nets. In one embodiment, the descriptions of the paths for the nets are output to a file 514 in processor-readable device 504 or another storage device.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for routing the nets of a logic design in a programmable logic device. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for routing a plurality of nets of a logic design in a programmable logic device (PLD) that includes a plurality of types of programmable interconnects, the method comprising:

reading a plurality of patterns from a library in a storage device, wherein each pattern includes an ordered set of one or more of the types of the programmable interconnects;

for each of the plurality of nets of the logic design, determining, by processor, a path from a source of the net to a destination of the net through a sequence of one or more of the programmable interconnects having types that respectively correspond to each type in the ordered set of a selected one of the patterns; and outputting a description of the path for each of the plurality of nets.

2. The processor-implemented method of claim 1, wherein the types of the programmable interconnects include a respective type for each of a plurality of lengths of the programmable interconnects.

3. The processor-implemented method of claim 1, wherein an order of the programmable interconnects in the sequence of the path for each net of the logic design corresponds to an order of the types in the ordered set of the selected pattern for the net.

4. The processor-implemented method of claim 1, wherein the determining the path for each net of the logic design includes performing a breadth-first search of a graph representing available connectivity of the programmable interconnects, the performing the breadth-first search including pruning from the breadth-first search each programmable interconnect having a type that does not match the type in the ordered set corresponding to a current level within the breadth-first search.

5. The processor-implemented method of claim 1, wherein the determining the path from the source to the destination for each net of the logic design includes determining a path from the source of the net to each of at least one destination of the net through a respective sequence of one or more programmable interconnects of the types in the ordered set of a selected one of the patterns for the source and the destination.

6. The processor-implemented method of claim 1, further comprising determining that a path does not exist from a source of an additional net of the logic design to a destination of the additional net through a sequence of programmable interconnects of the types in the ordered set for a selected one of the patterns, and, in response to the determining that the path does not exist, determining a path from the source to the destination through the programmable interconnects without using the patterns.

7. The processor-implemented method of claim 1, wherein the outputting of the description of the path for each net includes outputting the description of the path for each net to a file in the storage device.

8. The processor-implemented method of claim 1, further comprising selecting the selected one of the patterns in response to the source and the destination of the net.

9. The processor-implemented method of claim 1, further comprising selecting the selected one of the patterns in response to a magnitude of a horizontal offset between the source and the destination, a magnitude of a vertical offset between the source and the destination, a direction of the horizontal offset, a direction of the vertical offset, a type of the destination, and a type of the source.

10. The processor-implemented method of claim 1, further comprising selecting a plurality of the patterns that includes the selected one of the patterns in response to the destination of the net that is one of a plurality of functionally equivalent inputs of a look-up table of programmable logic of the PLD.

11. The processor-implemented method of claim 1, wherein the patterns in the library include a first and second pattern for a path from a source to a destination which is one of a plurality of functionally equivalent inputs of a look-up table of programmable logic of the PLD, the first pattern to a first subset of the functionally equivalent inputs differing from the second pattern to a second subset of the functionally equivalent inputs.

12. The processor-implemented method of claim 11, further comprising merging the first and second patterns into a tree pattern having nodes that represent the types of programmable interconnects in the first and second patterns for determining the path from the source to the destination.

13. The processor-implemented method of claim 1, further comprising generating the library of the plurality of patterns from an analysis of a plurality of paths routed for the PLD without using patterns.

14. The processor-implemented method of claim 13, wherein the analysis includes selecting the plurality of patterns from the paths which have a high quality for a metric that is one of a signal propagation delay for a path, a power dissipation for a path, a skew from a target propagation delay for a path, and a utilization of the programmable interconnects for a path.

15. The processor-implemented method of claim 1, further comprising dynamically modifying one of the patterns in response to the programmable interconnect of a type in the ordered set reaching an irregular programmable tile of the PLD, wherein the dynamically modifying the pattern includes inserting a type of programmable interconnect for traversing the irregular programmable tile into the ordered set after the type for the programmable interconnect reaching the irregular programmable tile.

16. The processor-implemented method of claim 1, further comprising removing an overlap of at least one shared programmable interconnect in the sequences of a first and second one of the nets, the removing the overlap including determining an alternative path from the source of the first net to the destination of the first net through another sequence of a respective one of the programmable interconnects for each type in the ordered set of a selected one of the patterns, wherein the respective programmable interconnect has the type.

17. A non-transitory program storage medium, comprising:

a processor-readable device configured with instructions, wherein execution of the instructions by one or more processors causes the one or more processors to perform operations including:

reading a plurality of patterns from a library in a storage device, wherein each pattern includes an ordered set of one or more of types of programmable interconnects;

for each of a plurality of nets of the logic design, determining a path from a source of the net to a destination of the net through a sequence of one or more of the programmable interconnects having types that respectively correspond to each type in the ordered set of a selected one of the patterns; and outputting a description of the path for each of the plurality of nets.

18. The program storage medium of claim 17, wherein the determining the path for each net of the logic design includes performing a breadth-first search of a graph representing available connectivity of the programmable interconnects, the performing the breadth-first search including pruning from the breadth-first search each programmable interconnect having a type that does not match the type in the ordered set corresponding to a current level within the breadth-first search.

19. The program storage medium of claim 17, wherein the types of the programmable interconnects include a respective type for each of a plurality of lengths of the programmable interconnects.

20. A system for routing a plurality of nets of a logic design in a programmable logic device (PLD) that includes a plurality of types of programmable interconnects, the system comprising:

means for reading a plurality of patterns from a library in a storage device, wherein each pattern includes an ordered set of one or more of the types of the programmable interconnects;

means for determining a path, for each of the plurality of nets of the logic design, from a source of the net to a destination of the net through a sequence of one or more of the programmable interconnects having types that respectively correspond to each type in the ordered set of a selected one of the patterns; and means for outputting a description of the path for each of the plurality of nets.

* * * * *